(12) United States Patent
Ding et al.

(10) Patent No.: US 10,990,130 B2
(45) Date of Patent: Apr. 27, 2021

(54) FLEXIBLE DISPLAY PANEL AND FILM-LIKE STRUCTURE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Yuankui Ding, Beijing (CN); Guangcai Yuan, Beijing (CN); Ce Zhao, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 146 days.

(21) Appl. No.: 15/752,451

(22) PCT Filed: Aug. 3, 2017

(86) PCT No.: PCT/CN2017/095825
§ 371 (c)(1),
(2) Date: Feb. 14, 2018

(87) PCT Pub. No.: WO2018/137329
PCT Pub. Date: Aug. 2, 2018

(65) Prior Publication Data
US 2020/0209921 A1  Jul. 2, 2020

(30) Foreign Application Priority Data

Jan. 25, 2017 (CN) .......................... 201720096939.1

(51) Int. Cl.
*G06F 1/16* (2006.01)
*B32B 7/05* (2019.01)
(Continued)

(52) U.S. Cl.
CPC .............. *G06F 1/1652* (2013.01); *B32B 5/00* (2013.01); *B32B 7/027* (2019.01); *B32B 7/05* (2019.01);
(Continued)

(58) Field of Classification Search
CPC ................ G06F 1/1641; G06F 1/1652; G06F 2203/04103; G06F 2203/04102;
(Continued)

(56) References Cited

U.S. PATENT DOCUMENTS

2005/0088830 A1\* 4/2005 Yumoto ................. H05K 1/147
361/749
2006/0204675 A1\* 9/2006 Gao .................. G02F 1/133377
428/1.1
(Continued)

FOREIGN PATENT DOCUMENTS

CN          103093699 A      5/2013
CN          103177656 A      6/2013
(Continued)

OTHER PUBLICATIONS

International Search Report and Written Opinion for Application No. PCT/CN2017/095825, dated Nov. 1, 2017, 9 Pages.
(Continued)

*Primary Examiner* — Adam B Dravininkas
(74) *Attorney, Agent, or Firm* — Brooks Kushman P.C.

(57) ABSTRACT

A flexible display panel and a film-like structure are provided according to the present disclosure. The flexible display panel includes a flexible display structure and a film-like structure arranged on at least one side of the flexible display structure. The film-like structure includes: a first flexible layer, a second flexible layer, a filler sealed between the first flexible layer and the second flexible layer,
(Continued)

and a heater configured to heat the filler. A hardness of the filler varies with a temperature of the filler.

20 Claims, 2 Drawing Sheets

(51) Int. Cl.
  *B32B 7/027*  (2019.01)
  *B32B 5/00*   (2006.01)
  *B32B 9/00*   (2006.01)
  *H05K 5/00*   (2006.01)
  *H05K 7/20*   (2006.01)
(52) U.S. Cl.
  CPC ............. *B32B 9/00* (2013.01); *G06F 1/1616* (2013.01); *G06F 1/1641* (2013.01); *H05K 5/0017* (2013.01); *H05K 7/20954* (2013.01); *B32B 2307/30* (2013.01); *B32B 2457/20* (2013.01)
(58) Field of Classification Search
  CPC .... G06F 1/1626; G06F 1/1637; G06F 1/1616; B32B 7/05; B32B 7/027; B32B 5/00; B32B 9/00; B32B 2307/30; B32B 2457/40; B32B 27/08; B32B 2457/20; B32B 7/02; H05K 1/189; H05K 1/147; H05K 2201/10128; H05K 5/0017; H05K 7/20954; G09F 9/30; G09F 9/301
  See application file for complete search history.

(56) References Cited

U.S. PATENT DOCUMENTS

| | | | |
|---|---|---|---|
| 2013/0114193 A1 | 5/2013 | Joo et al. | |
| 2014/0041800 A1* | 2/2014 | Okuyama | B29C 66/41 156/247 |
| 2014/0118910 A1 | 5/2014 | Sung et al. | |
| 2014/0376162 A1* | 12/2014 | Lim | G09F 9/33 361/679.01 |
| 2015/0180099 A1* | 6/2015 | Hino | H01M 10/6551 429/120 |
| 2015/0349290 A1* | 12/2015 | Iwase | B32B 7/12 428/213 |
| 2016/0037657 A1* | 2/2016 | Yoshizumi | G09F 9/35 361/679.01 |
| 2018/0162095 A1* | 6/2018 | Lim | B32B 3/02 |

FOREIGN PATENT DOCUMENTS

| | | |
|---|---|---|
| CN | 104756176 A | 7/2015 |
| CN | 105096750 A | 11/2015 |
| CN | 105608999 A | 5/2016 |
| JP | 2011197514 A | 10/2011 |
| WO | 2014176528 A1 | 10/2014 |

OTHER PUBLICATIONS

First Office Action for Indian Application No. 201827007428, dated May 29, 2020, 5 Pages.

* cited by examiner

FLEXIBLE DISPLAY PANEL AND FILM-LIKE STRUCTURE

CROSS-REFERENCE TO RELATED APPLICATIONS

This application is the U.S. national phase of PCT Application No. PCT/CN2017/095825 filed on Aug. 3, 2017, which claims priority to Chinese Patent Application No. 201720096939.1 filed on, Jan. 25, 2017, which are incorporated herein by reference in their entireties.

TECHNICAL FIELD

The present disclosure relates to the field of flexible display, in particular to a flexible display panel and a film-like structure.

BACKGROUND

With the development of the flexible display technology, flexible display products will be gradually popularized in the display market. A current flexible display screen can be wound according to the user's requirement. The screen requires an external force to maintain a particular winding state or spread to be a plane, and thus the flexible display screen requires a particular bracket to maintain a shape.

In the related art, an electrorheological fluid is generally used as filler inside the bracket, and the flexibility and rigidity are switched directly based on current characteristics of the electrorheological fluid so as to maintain the shape of the flexible display screen. However, since its structure is complex, and its repeatability is limited by the stability of the electrorheological fluid, the bracket having the electrorheological fluid is not ideal in practical applications.

In view of the above, there is an urgent need for a practical technical solution to control the flexible display screen to be switched between flexibility and rigidity.

SUMMARY

Embodiments of the present disclosure provide a more practical technical solution to control a flexible display panel to be switched between flexibility and rigidity.

In order to achieve the above object, in an aspect, an embodiment of the present disclosure provides a flexible display panel, which includes a flexible display structure and a film-like structure arranged on at least one side of the flexible display structure. The film-like structure includes: a first flexible, layer, a second flexible layer, a filler sealed between the first flexible layer and the second flexible layer, and a heater configured to heat the filler. A hardness of the filler varies with a temperature of the filler.

Optionally, the film-like structure is arranged on a first surface of the flexible display structure.

Optionally, the filler includes a thermal characteristic material, the thermal characteristic material is in a solid state in a case that the temperature is within a first threshold interval, and the thermal characteristic material is in a liquid state in a case that the temperature is within a second threshold interval.

Optionally, the thermal characteristic material includes at least one of wax and resin.

Optionally, the filler further includes a flexible porous layer, the flexible porous layer includes at least one porous structure, and the thermal characteristic material is filled in the porous structure.

Optionally, the heater includes a metal frame and a wire connected with the metal frame.

Optionally, the metal frame and a portion of the wire are arranged between the first flexible layer and the second flexible layer, and the other portion of the wire extends to an outside of the first flexible layer and the second flexible layer.

Optionally, the flexible display panel further includes a power supply connected with the wire and a switch configured to control the wire to be connected or disconnected with the power supply.

Optionally, the filler includes a flexible porous layer, the flexible porous layer includes a plurality of porous structures, the thermal characteristic material is filled in the porous structures, the heater includes a metal frame and a wire connected with the metal frame, the metal frame is of a grid structure, and the porous structures are arranged in grids of the grid structure.

Optionally, the flexible porous layer is a sponge.

Optionally the film-like structure further includes a cooler configured to cool the filler.

Optionally, the cooler includes a plurality of piezoelectric cooling components arranged at intervals, each of the piezoelectric cooling components includes a cold surface and a hot surface, and the cold surface is configured to cool the filler.

In another aspect, another embodiment of the present disclosure further provides a method for controlling a flexible display panel to be switched between rigidity and flexibility. The flexible display panel includes a flexible display structure and a structure arranged on at least one side of the flexible display structure. The film-like structure includes: a first flexible layer, a second flexible layer, a filler sealed between the first flexible layer and the second flexible layer, and a heater configured to heat the filler. A hardness of the filler varies with a temperature of the filler. The method includes: controlling, by the heater, the temperature of the filler to be increased from a first threshold interval within which the filler is in a solid state to a second threshold interval within which the filler is in a liquid state; and controlling, by the cooler, the temperature of the filler to be decreased from the second threshold interval to the first threshold interval.

In another aspect, another embodiment of the present disclosure further provides a film-like structure, which includes a first flexible layer, a second flexible layer, a filler sealed between the first flexible layer and the second flexible layer, and a heater configured to heat the fillet. A hardness of the filler varies with a temperature of the filler.

Optionally the filler includes a thermal characteristic material, the thermal characteristic material is in a solid state in a case that the temperature is within a first threshold interval, and the thermal characteristic material is in a liquid state in a case that the temperature is within a second threshold interval.

Optionally, the thermal characteristic material includes at least one of wax and resin.

Optionally, the filler further includes a flexible porous layer, the flexible porous layer includes at least one porous structure, and the thermal characteristic material is filled in the at least one porous structure.

Optionally, the flexible porous layer is a sponge.

Optionally, the heater includes a metal frame and a wire connected with the metal frame.

Optionally, the film-like structure further includes a cooler configured to cool the filler.

Optionally, the cooler includes a plurality of piezoelectric cooling components arranged at intervals, each of the piezoelectric cooling components includes a cold surface and a hot surface, and the cold surface is configured to cool the filler.

DETAILED DESCRIPTION

To make the technical problem to be solved, the technical solution and disadvantages of the present disclosure clearer, specific embodiments will be described below in detail in conjunction with the drawings.

Figure 1:
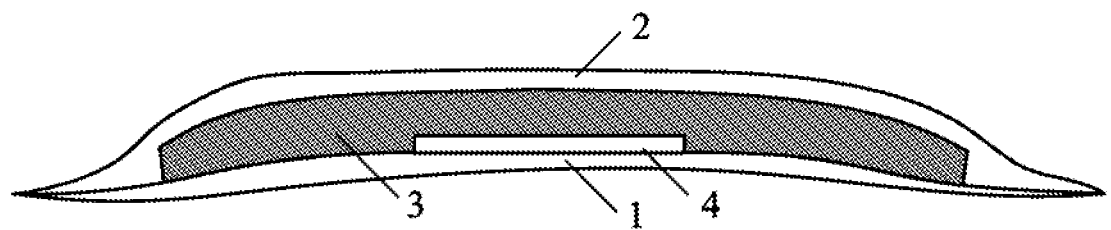
FIG. 1 is a schematic diagram of a film-like structure according to an embodiment of the present disclosure.

An embodiment of the present disclosure provides a film-like structure as shown in FIG. 1. The film-like structure includes: a first flexible layer 1, a second flexible layer 2, a filler 3 arranged between the first flexible layer 1 and the second flexible layer 2, and a heater 4 configured to heat the filler 3. The heater 4 may be arranged between the first flexible layer 1 and the second flexible layer 2, and may also not be arranged between the first flexible layer 1 and the second flexible layer 2. FIG. 1 is only for exemplary description.

Edges of the first flexible layer 1 and edges of the second flexible layer 2 are closed so as to seal the filler 3. A hardness of the filler 3 varies with the ambient temperature.

It should be appreciated that the film-like structure in the embodiment can achieve a switch between flexibility and rigidity in hardness based on the temperature change and can be configured to fix a shape of the flexible display panel. Compared with the technical solution of using an electrorheological liquid bracket in the related art, the structure in the embodiment is simpler, and the heating method is easier to implement in practical applications than a method of controlling an electrical state of the electro-rheological liquid. Therefore, the film-like structure in the embodiment has more advantages in practicability and is conducive for flexible display products to be popularized in the market.

The "hardness" refers to the capability of a material locally resisting a hard object to press into the surface of the material. For example, the wax gradually becomes harder during solidification. The "rigidity" refers to the capability of a material or a structure resisting deformation when stressed.

Hereinafter the film-like structure in the embodiment will be described in detail in conjunction with specific implementations.

Specifically at least a portion of the filler in the embodiment is made of thermal characteristic material. The thermal characteristic material is solid in a case that the ambient temperature (that is, a temperature of the thermal characteristic material) is within a first threshold interval, and the thermal characteristic material is liquid in a case that the ambient temperature is within a second threshold interval. The first threshold interval and the second threshold interval refer to different temperature ranges.

As exemplary description, the thermal characteristic material in the embodiment may be a wax. The wax is solid at a normal temperature, and is liquid after being heated, and the wax is environmentally friendly. Therefore, the max is well suited as the filler.

In the case that the wax is heated to a liquid state, the film-like structure in the embodiment is flexible, and may be wound together with the flexible display panel. In the case that the wax is in a solid state at a normal temperature, the film-like structure is ensured to have a certain structural strength, such that the flexible display panel is rigid to maintain the current shape.

In view of the brittleness of the wax as the filler in the solid state, the toughness of the film-like structure may decrease. As a solution to avoid the above problem, the filler in the embodiment may further include a flexible porous layer. The flexible porous layer includes at least one porous structure (such as a sponge). The wax is filled in the porous structure of the flexible porous layer.

The combination of the flexible porous layer and the wax can avoid the disadvantage that the filler is brittle so as to improve the overall toughness of the film-like structure, and thus the film-like structure may stably maintain the shape of the flexible display panel.

Figure 2:
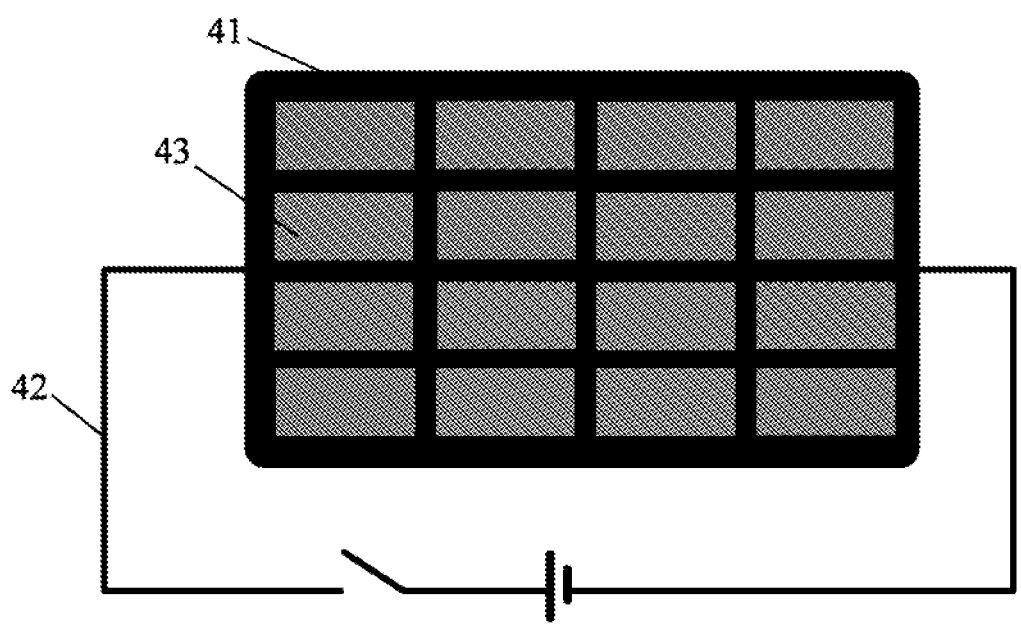
FIG. 2 is a schematic diagram of an arrangement of a heater and a filler of a film-like structure according to an embodiment of the present disclosure.

Further, as shown in FIG. 2, the heater in the embodiment includes a metal frame 41 and a wire 42 connected with the metal frame.

Figure 4:
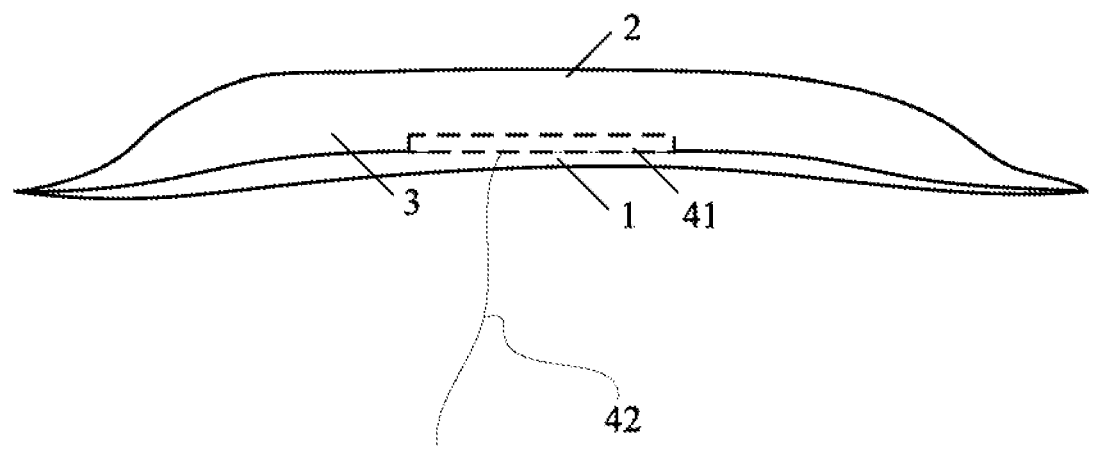
FIG. 4 is a schematic diagram of a film-like structure according to another embodiment of the present disclosure.

The metal frame 41 and a portion of the wire 42 are arranged between the first flexible layer and the second flexible layer, and the other portion of the wire extends to an outside of the first flexible layer and the second flexible layer to be connected with a power supply, as shown in FIG. 1 and FIG. 4.

The metal frame 41 may be acted as a resistor. After the wire 42 is powered, the temperature of the metal frame 41 increases to heat the thermal characteristic material.

In practical applications, the metal frame 41 of the embodiment may be of a grid structure, and the flexible porous layer 43 filled with the thermal characteristic material is arranged in the grids, which may enable the metal frame 41 to be uniformly heated.

The above description of the film-like structure in the embodiment is exemplary. It should be noted that the scope of the present disclosure is not be limited by the above implementations.

As an example, the first flexible layer and the second flexible layer in the embodiment may be regarded as a whole and are not limited to two independent layers, or the film-like structure includes more flexible layers.

As another example, the heater in the embodiment is not limited to the metal frame and the wire, and any component that can be used as a resistor may be applied to the solution of heating in a current manner. Therefore, the heater may only include a metal wire with a portion of the metal wire acted as a heating wire, and other heating manner may also be used.

As another example, the thermal characteristic material in the embodiment is not limited to the wax and may be a resin or a polymer material with the similar characteristic, and the thermal characteristic material may also be a mixed material, such as a mixture of wax and resin.

Figure 5:
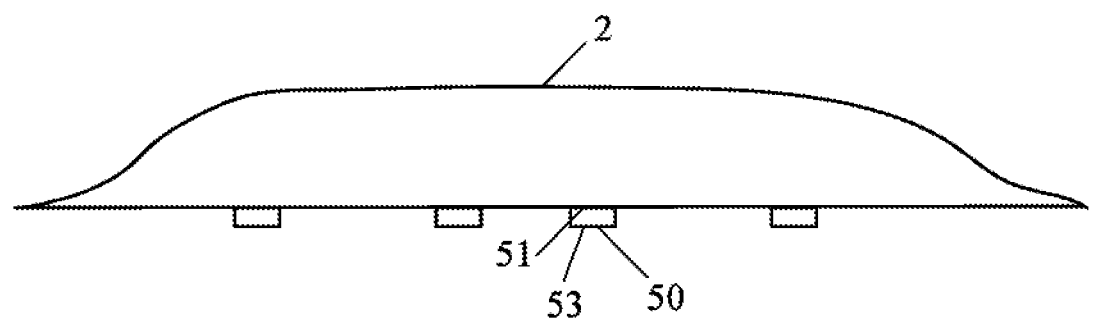
FIG. 5 is a schematic diagram of a film-like structure according to another embodiment of the present disclosure.

In addition, as shown in FIG. 5, the film-like structure further includes a cooler configured to cool the filler. The cooler includes a plurality of piezoelectric cooling components 50 arranged at intervals. The piezoelectric cooling components 50 are arranged at intervals to meet the flexible requirement of the film-like structure. Each of the piezoelectric cooling components 50 includes a cold surface 51 and a hot surface 53, and the cold surface 51 is configured to cool the filler. In the embodiment as shown in FIG. 5, the cold surface 51 is attached to the first flexible layer 1, and the hot surface 53 is arranged away from the first flexible layer 1.

Implementations of the embodiment are not unique, and the implementations are not described herein one by one by taking an example.

In another aspect, another embodiment of the present disclosure further provides a flexible display panel. The flexible display panel includes a flexible display structure 31 and a film arranged on at least one side of the flexible display structure 31. The film adopts the above film-like structure according to the present disclosure.

In an embodiment, the film is arranged on a first surface of the flexible display structure 31, and the first surface of the flexible display structure 31 may be a non-light-emitting surface of the flexible display structure 31.

According to the design of the film structure of the present disclosure, the flexible display panel can be switched between flexibility and rigidity only by heating the film or stopping the heating or cooling the film. Due to the simple implementation, the design of the film structure has a high practicality and has a great significance on the market popularity of the flexible display panel.

Further, if the heater of the film of the flexible display panel in the embodiment includes the metal frame 41 and the wire 42 connected with the metal frame as shown in FIG. 2, the flexible display panel in the embodiment further includes: a power supply connected to the wire, and a switch configured to control the wire to be connected or disconnected with the power supply.

Figure 3:
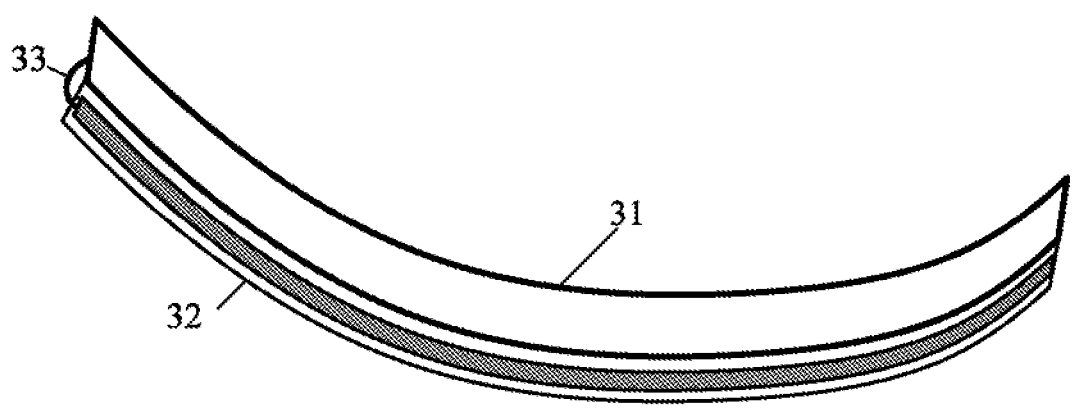
FIG. 3 is a schematic diagram of an application of a flexible display panel according to an embodiment of the present disclosure.

In practical application, as shown in FIG. 3, the film 32 of the embodiment accesses the power supply of the flexible display panel via the wire 33. If a user wants to wind the flexible display panel 31 in a desired shape, it is only required to control the power supply of the flexible display panel to power the heater of the film 32, thereby decreasing the hardness of the filler in the film 32 by the heating.

In a case that the hardness of the filler is decreased to a certain extent, the flexible display panel is flexible, and in this case, the user may wind the flexible display panel. After the flexible display panel is wound into the desired shape, the user may turn off the power supply, and then the heater stops heating. In the process of cooling the filler, its hardness gradually increases, so that the film 32 may provide support for the flexible display panel 31. In this case, the flexible display panel is rigid and may keep the current shape.

It can be seen from the above practical application that the flexible display panel can be switched between flexibility and rigidity through the film-like structure in the solution of the present disclosure. Compared with the bracket in the related art, the film in the present disclosure has a smaller volume and a better user experience for users.

In addition, another embodiment of the present disclosure further provides a method of controlling the above flexible display panel to be switched between rigidity and flexibility. The method includes: controlling, by the heater, the temperature of the filler to be increased from a first threshold interval within which the filler is in a solid state to a second threshold interval within which the filler is in a liquid state; and controlling, by the cooler, the temperature of the filler to be decreased from the second threshold interval to the first threshold interval.

The above embodiments are merely optional embodiments of the present disclosure. It should be noted that some improvements and modifications can be made by those skilled in the art without departing from the principle of the present disclosure, and these improvements and modifications shall also fall within the scope of the present disclosure.

What is claimed is:

1. A flexible display panel, comprising:
   a flexible display structure; and
   a film-like structure on at least one side of the flexible display structure,
   wherein the film-like structure comprises: a first flexible layer, a second flexible layer, a filler sealed between the first flexible layer and the second flexible layer, and a heater configured to heat the filler;
   wherein a hardness of the filler varies with a temperature of the filler.

2. The flexible display panel according to claim 1, wherein the filler comprises a thermal characteristic material, the thermal characteristic material is in a solid state in a case that the temperature is within a first threshold interval, and the thermal characteristic material is in a liquid state in a case that the temperature is within a second threshold interval.

3. The flexible display panel according to claim 2, wherein the thermal characteristic material comprises at least one of wax and resin.

4. The flexible display panel according to claim 2, wherein the filler further comprises a flexible porous layer, and the flexible porous layer comprises at least one porous structure; and
   wherein the thermal characteristic material is filled in the at least one porous structure.

5. The flexible display panel according to claim 2, wherein the filler comprises a flexible porous layer, the flexible porous layer comprises a plurality of porous structures, and the thermal characteristic material is filled in the porous structures;
   wherein the heater comprises a metal frame and a wire connected with the metal frame, the metal frame is of a grid structure, and the porous structures are arranged in grids of the grid structure.

6. The flexible display panel according to claim 5, wherein the flexible porous layer is a sponge.

7. The flexible display panel according to claim 1, wherein the heater comprises a metal frame and a wire connected with the metal frame.

8. The flexible display panel according to claim 7, wherein the metal frame and a portion of the wire are between the first flexible layer and the second flexible layer, and the other portion of the wire extends to an outside of the first flexible layer and the second flexible layer.

9. The flexible display panel according to claim 7, further comprising: a power supply connected with the wire; and a switch configured to control the wire to be connected or disconnected with the power supply.

10. The flexible display panel according to claim 1, wherein the film-like structure further comprises a cooler configured to cool the filler.

11. The flexible display panel according to claim 10, wherein the cooler comprises a plurality of piezoelectric cooling components arranged at intervals, each of the piezoelectric cooling components comprises a cold surface and a hot surface, and the cold surface is configured to cool the filler.

12. A method for controlling a flexible display panel to be switched between rigidity and flexibility, wherein the flexible display panel comprises: a flexible display structure and a film-like structure arranged on at least one side of the flexible display structure, the film-like structure comprises: a first flexible layer, a second flexible layer, a filler sealed between the first flexible layer and the second flexible layer, and a heater configured to heat the filler, and a hardness of the filler varies with a temperature of the filler; and wherein the method comprises:
controlling, by the heater, the temperature of the filler to be increased from a first threshold interval within which the filler is in a solid state to a second threshold interval within which the filler is in a liquid state; and
controlling, by the cooler, the temperature of the filler to be decreased from the second threshold interval to the first threshold interval.

13. A film-like structure, comprising:
a first flexible layer;
a second flexible layer;
a filler sealed between the first flexible layer and the second flexible layer; and
a heater configured to heat the filler;
wherein a hardness of the filler varies with a temperature of the filler.

14. The film-like structure according to claim 13, wherein the filler comprises a thermal characteristic material, the thermal characteristic material is in a solid state in a case that the temperature is within a first threshold interval, and the thermal characteristic material is in a liquid state in a case that the temperature is within a second threshold interval.

15. The film-like structure according to claim 14, wherein the thermal characteristic material comprises at least one of wax and resin.

16. The film-like structure according to claim 15, wherein the filler further comprises a flexible porous layer, the flexible porous layer comprises at least one porous structure, and the thermal characteristic material is filled in the porous structure.

17. The film-like structure according to claim 15, wherein the flexible porous layer is a sponge.

18. The film-like structure according to claim 13, wherein the heater comprises a metal frame and a wire connected with the metal frame.

19. The film-like structure according to claim 13, wherein the film-like structure further comprises a cooler configured to cool the filler.

20. The film-like structure according to claim 19, wherein the cooler comprises a plurality of piezoelectric cooling components arranged at intervals, each of the piezoelectric cooling components comprises a cold surface and a hot surface, and the cold surface is configured to cool the filler.

* * * * *